( 12 ) United States Patent
Kim et al.

(10) Patent No.: US 7,420,814 B2
(45) Date of Patent: Sep. 2, 2008

(54) PACKAGE STACK AND MANUFACTURING METHOD THEREOF

(75) Inventors: Jae-Hong Kim, Cheonan-si (KR);
Heui-Seog Kim, Cheonan-si (KR);
Wha-Su Sin, Cheonan-si (KR);
Jong-Keun Jeon, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/100,525

(22) Filed: Apr. 7, 2005

(65) Prior Publication Data

US 2006/0076665 A1    Apr. 13, 2006

(30) Foreign Application Priority Data

Oct. 7, 2004    (KR) ...................... 10-2004-0079881

(51) Int. Cl.
    H05K 1/14    (2006.01)
(52) U.S. Cl. ........................ 361/735; 361/790; 257/686; 257/723; 438/108; 438/109
(58) Field of Classification Search ................. 361/735, 361/790; 257/678, 686, 723, 777, 784; 438/106, 438/107, 108, 109
    See application file for complete search history.

(56) References Cited

U.S. PATENT DOCUMENTS

| 5,883,426 | A  | * | 3/1999  | Tokuno et al. ............... | 257/686 |
| 5,973,930 | A  | * | 10/1999 | Ikeda et al. .................. | 361/768 |
| 6,025,648 | A  | * | 2/2000  | Takahashi et al. ............ | 257/778 |
| 6,069,025 | A  | * | 5/2000  | Kim ............................ | 438/109 |
| 6,287,892 | B1 | * | 9/2001  | Takahashi et al. ............ | 438/107 |
| 6,404,044 | B2 | * | 6/2002  | Akram et al. ................ | 257/686 |
| 6,462,412 | B2 | * | 10/2002 | Kamei et al. ................. | 257/723 |

6,614,104 B2    9/2003    Farnworth et al.

(Continued)

FOREIGN PATENT DOCUMENTS

KR    2003-0040922    5/2003

(Continued)

*Primary Examiner*—Dean A. Reichard
*Assistant Examiner*—Dameon E. Levi
(74) *Attorney, Agent, or Firm*—Harness, Dickey & Pierce, P.L.C.

(57) ABSTRACT

A package stack may include a first package and a second package. The first package may have an IC chip with an active surface and a back surface. The active surface may be connected to a first major surface of a first circuit substrate. The second package may include a second IC chip with an active surface and a back surface. The back surface of the second IC chip may be attached to a first major surface of a second circuit substrate and the active surface of the second IC chip may be electrically connected to the first major surface of the second circuit substrate. The first package may be stacked on the second package so that the active surface of the second package may be electrically connected to a second major surface of the first circuit substrate of the first package. A method may involve providing a first package having a first IC chip and a first circuit substrate and providing a second package having a second IC chip and a second circuit substrate. The first and the second packages may be stacked so that the active surface of the second IC may face and be electrically connected to a major surface of the first circuit substrate.

18 Claims, 6 Drawing Sheets

U.S. PATENT DOCUMENTS

| | | | |
|---|---|---|---|
| 6,791,192 B2 * | 9/2004 | Lin et al. | 257/777 |
| 6,911,721 B2 * | 6/2005 | Aoyagi | 257/678 |
| 6,952,049 B1 * | 10/2005 | Ogawa et al. | 257/700 |
| 6,972,481 B2 * | 12/2005 | Karnezos | 257/686 |
| 7,026,709 B2 * | 4/2006 | Tsai et al. | 257/686 |
| 7,049,691 B2 * | 5/2006 | Karnezos | 257/686 |
| 7,049,692 B2 * | 5/2006 | Nishimura et al. | 257/686 |
| 7,053,476 B2 * | 5/2006 | Karnezos | 257/686 |
| 7,053,477 B2 * | 5/2006 | Karnezos et al. | 257/686 |
| 7,057,269 B2 * | 6/2006 | Karnezos | 257/686 |
| 7,061,088 B2 * | 6/2006 | Karnezos | 257/686 |
| 7,064,426 B2 * | 6/2006 | Karnezos | 257/686 |
| 7,196,407 B2 * | 3/2007 | Takahashi | 257/686 |
| 7,205,646 B2 * | 4/2007 | Lin et al. | 257/686 |
| 7,205,647 B2 * | 4/2007 | Karnezos | 257/686 |
| 2003/0122240 A1 * | 7/2003 | Lin et al. | 257/686 |
| 2004/0140544 A1 * | 7/2004 | Naka et al. | 257/678 |
| 2004/0145039 A1 * | 7/2004 | Shim et al. | 257/678 |
| 2004/0173914 A1 * | 9/2004 | Kurihara et al. | 257/778 |
| 2004/0210256 A1 * | 10/2004 | Musley et al. | 607/5 |
| 2004/0212056 A1 * | 10/2004 | Chen et al. | 257/678 |

FOREIGN PATENT DOCUMENTS

| | | |
|---|---|---|
| KR | 10-2004-0035444 | 4/2004 |

\* cited by examiner

PACKAGE STACK AND MANUFACTURING METHOD THEREOF

PRIORITY STATEMENT

This U.S. non-provisional application claims benefit of priority under 35 U.S.C. §119 of Korean Patent Application No. 2004-79881, filed on Oct. 7, 2004, the entire contents of which are incorporated herein by reference.

BACKGROUND OF THE INVENTION

1. Field of the Invention

The present invention relates generally to semiconductor package technology and, more particularly, to a package stack structure and a manufacturing method thereof.

2. Description of the Prior Art

Stacking technology may generally be classified into a chip stacking method or a package stacking method. On the one hand, the chip stacking method may have an advantage in terms of overall size (e.g., the thickness of semiconductor). On the other hand, the package stacking method may have advantages in terms of reliability and yields because individual packages, which have passed reliability testing, may be stacked together.

In a package stack having individual packages stacked together, a medium may be provided to electrically interconnect the individual packages. A typical medium is solder bumps.

Figure 1A:
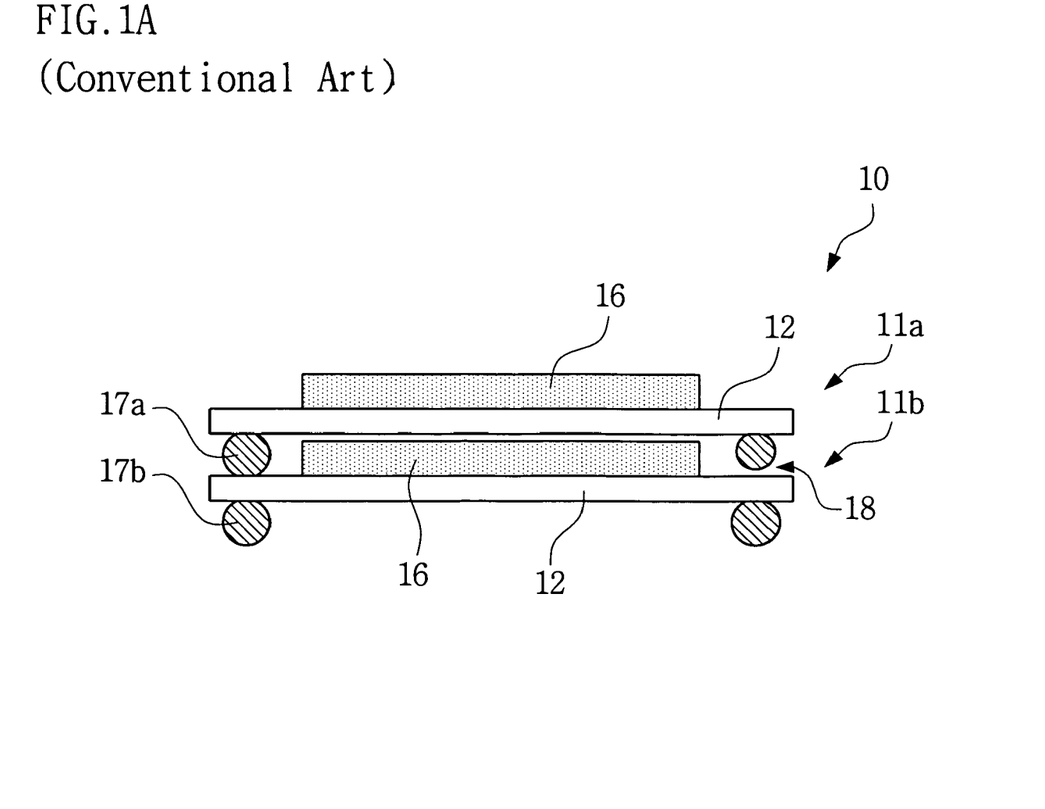
FIGS. 1A and 1B are cross-sectional views of a conventional package stack.
Figure 1B:
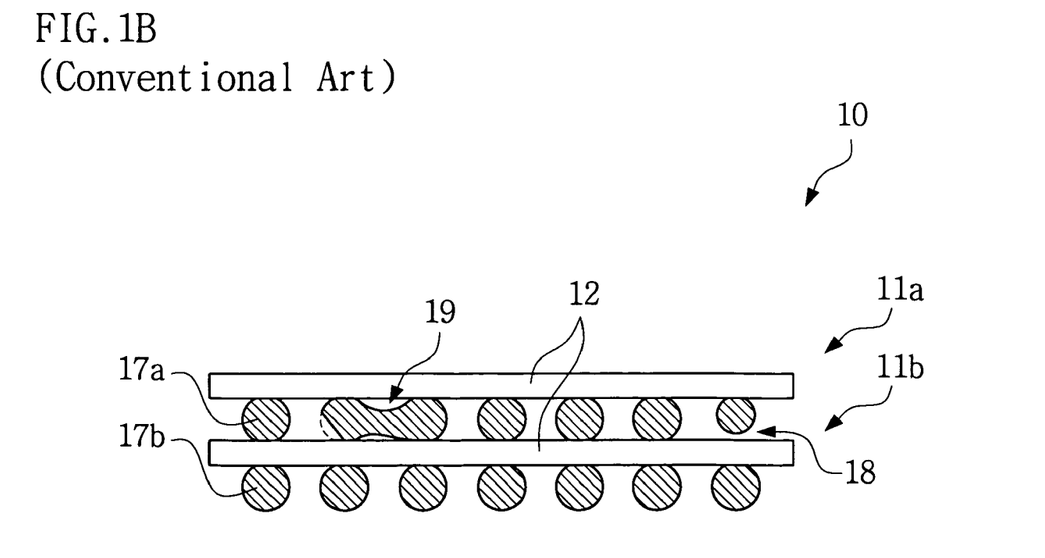

A conventional package stack 10 using solder balls is shown in FIGS. 1A and 1B. FIGS. 1A and 1B are cross-sectional views of the package stack 10 taken in different directions. Referring to FIGS. 1A and 1B, the package stack 10 may have a structure in which two individual packages 11a and 11b may be stacked. The individual packages 11a and 11b may include molding resin 16 formed on a surface of a circuit substrate 12 and solder bumps 17a and 17b formed on an opposite surface of the circuit substrate 12. Inside the molding resin 16, an integrated circuit chip (hereinafter IC chip; not shown) may be attached and connected electrically to the circuit substrate 12.

The solder bumps 17a on the surface of the upper package 11a may interconnect the upper package 11a and the lower package 11b electrically. The solder bumps 17b on the surface of the lower package 11b may serve as external connection terminals when the package stack 10 is mounted onto a motherboard (not shown), for example.

The following example method may be employed to form the solder bumps 17a and 17b. The surface of the circuit substrate 12 may include a land (or site) on which the solder bumps 17a and 17b may be formed. Flux may be applied onto the land and solder bumps may be attached onto the flux, and then melted by a reflow process. Such bump forming techniques are well known in this art.

Although the conventional package stack 10 is generally thought to be acceptable, it is not without shortcomings. Some shortcomings may relate to the solder bumps 17a and 17b.

The solder bumps 17b may provide mechanical and electrical connections between the package stack 10 and other devices(e.g., a motherboard). Such connections may be achieved via a reflow process. During the reflow process, however, the solder bumps 17a connecting the individual packages 11a and 11b may melt, which may cause a separation 18 (FIGS. 1A and 1B) of the connections between the solder bumps or a short circuit 19 (FIG. 1B) between adjacent solder bumps(19 in FIG. 1B). The same problem may for any given package within the package stack 10. As the number of packages included in the package stack increases, so may the number reflow processes, and thereby defects related to the solder balls may occur more frequently.

Another problem is that loose connections between balls may be caused by a warpage phenomenon of the circuit substrate 12. Each constituent element of the package stack 10 such as the circuit substrate 12, the molding resin 16 and the IC chip may have a different coefficient of thermal expansion. If a high temperature process like a reflow process is repeated, then the warpage phenomenon of the circuit substrate may arise. Accordingly, at both ends of the circuit substrate 12, where a relatively high warpage phenomenon may appear, the solder balls 17a may become loosened from the lower circuit substrate 12, which may lead to separated connections.

SUMMARY OF THE INVENTION

According to an example, non-limiting embodiment of the present invention, a first package may include a first IC chip having an active surface and a back surface, and a first circuit substrate having a first major surface and a second major surface. The active surface of the first IC chip may face and be electrically connected to the first major surface of the first circuit substrate. A second package may include a second IC chip having an active surface and a back surface, and a second circuit substrate having a first major surface and a second major surface. The back surface of the second IC chip may face the first major surface of the second circuit substrate and the active surface of the second IC chip may be electrically connected to the first major surface of the second circuit substrate. The first package may be stacked on the second package and the active surface of the second IC chip may face and be electrically connected to the second major surface of the first circuit substrate. Bonding wires may be provided to electrically connect the active surface of the second circuit substrate to the first major surface of the second circuit substrate.

According to another example, non-limiting embodiment of the present invention, a method may involve providing a first package having a first IC chip with an active surface and a back surface. The active surface of the first IC chip may face and be electrically connected to a first major surface of a first circuit substrate. The method may also involve providing a second package having a second IC chip with an active surface and a back surface. The back surface of the second IC chip may face a first major surface of a second circuit substrate and the active surface of the second IC chip may be electrically connected to the first major surface of the second circuit substrate. The first package and the second package may be stacked so that the active surface of the second IC chip may face and be electrically connected to a second major surface of the first circuit substrate. The active surface of the second IC chip may be electrically connected to the first major surface of the second circuit substrate by a bonding wire.

According to another example, non-limiting embodiment of the present invention, a package stack may include a first package with a first IC chip that may be electrically connected to a first circuit substrate. An active surface of the first IC chip may face the first circuit substrate. A second package may include a second IC chip that may be electrically connected to a second circuit substrate. An active surface of the second IC chip may face away from second circuit substrate. The first package may be stacked on the second package so that the active surface of the second IC chip may face and be electrically connected to the first circuit substrate.

DETAILED DESCRIPTION OF EXAMPLE EMBODIMENTS

A detailed explanation of example, non-limiting embodiments of the present invention will follow with reference to the attached drawings.

It is to be appreciated that the Figures are not drawn to scale. Rather, for simplicity and clarity of illustration, the dimensions of some components may be exaggerated, omitted, or outlined. Further, a layer is considered as being formed "on" another layer or a substrate when formed either directly on the referenced layer or the substrate or formed on other layers or patterns overlaying the referenced layer. The same reference number is given to the same or corresponding component in the drawings.

Figure 2A:
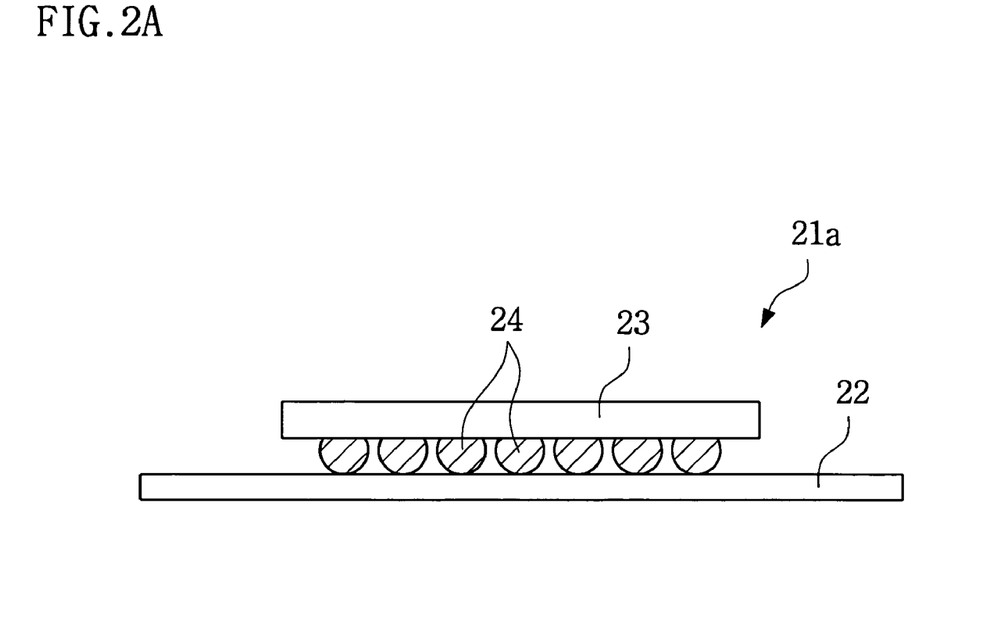
FIGS. 2A through 2E are cross-sectional views showing a package stack and a manufacturing method thereof according to an example embodiment of the present invention.

FIGS. 2A to 2E are cross-sectional views of a package stack 20 and a manufacturing method thereof in accordance with an example, non-limiting embodiment of the present invention. Referring to FIG. 2A, a first package 21a may be manufactured by flip chip bonding, which is well known chip mounting technique.

An IC chip 23 of the first package 21a may include a chip bump 24. The chip bump 24 may be connected to a chip pad (not shown) distributed on an active surface of the IC chip 23 by a rerouting line. Alternatively, the chip bump 24 may be provided directly on the chip pad. Connecting techniques using a rerouting line are well known in wafer level package technologies, and therefore a detailed explanation is omitted. By way of example only, and not as a limitation of the invention, the chip bump 24 may be fabricated from a solder material including tin (Sn) and lead (Pb) or a lead-free solder, or some other suitable metal material such as nickel (Ni), gold (Au), silver (Ag), copper (Cu) and bismuth (Bi). Numerous other suitable materials are well known in this art and therefore a detailed description of the same is omitted.

First lands (not shown) may be distributed on the surface of the circuit substrate 22 facing toward the IC chip 23, and second lands (not shown) may be distributed on the surface of the circuit substrate 22 facing away from the IC chip 23. The first lands may provide sites where the chip bumps 24 may be attached, and the second lands may provide sites where the chip bumps of a second package may be attached. The first lands and the second lands may be electrically connected together through conductive vias. By way of example only, and not as a limitation of the invention, each first land may be electrically connected to a corresponding second land so that the first and the corresponding second lands may have the same electrical paths through the circuit substrate 22. Those skilled in the art will appreciate, however, that any desired electrical path between the first and the second lands may be suitably implemented by providing the circuit substrate 22 with an appropriately patterned metallization layer.

The IC chip 23 may be "flipped" so that the active surface (and thus the chip pads and chip bumps 24) may face the circuit substrate 22, and the IC chip 23 may be attached to the surface of the circuit substrate 22. Here, the chip bumps 24 may be connected to the first lands on the surface of the circuit substrate 22 by a flip chip bonding method. An underfill process may be carried out in which an encapsulating resin (26a in FIG. 2E) may be provided between the surface of the circuit substrate 22 and the active surface of the IC chip 23. Numerous flip chip bonding methods, underfill processes and encapsulating resin materials are well known in this art and therefore a detailed description of the same is omitted.

Figure 2B:
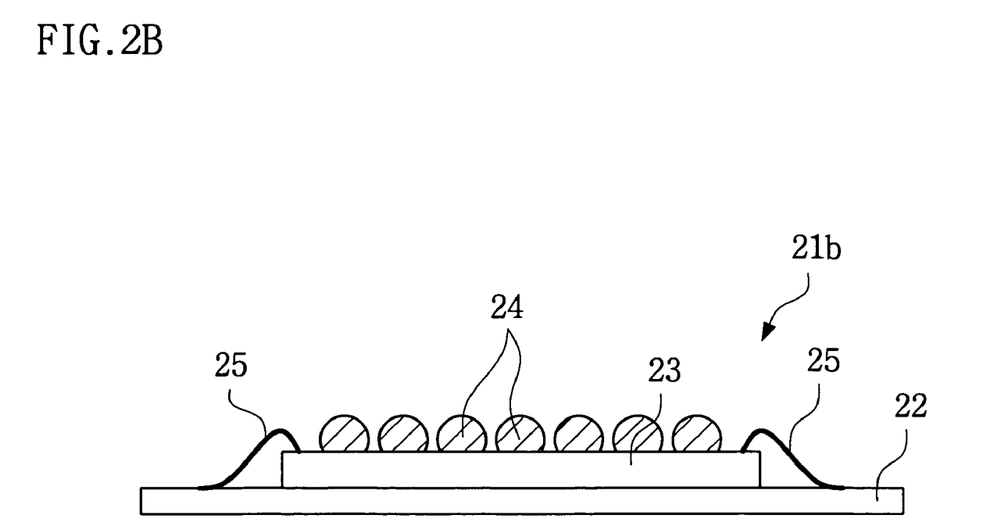

Referring to FIG. 2B, a second package 21b may be manufactured by well known chip attaching methods and well known wire bonding techniques, for example.

The second package 21b may include an IC chip 23 having an active surface on which chip bumps 24 are provided. The active surface of the IC chip 23 may also include a first wire pad (not shown). The first wire pad may provide a site where one end of a bonding wire 25 may be connected. A chip pad may be used as the first wire pad, or a separately formed pad may be used as the first wire pad and the separately formed pad may be connected to the chip pad by a rerouting line.

The circuit substrate 22 of the second package 21b may include first lands (not shown) distributed on the surface facing toward the IC chip 23, and second lands (not shown) distributed on the surface facing away from the IC chip 23. The first and the second lands of the second package 21b may be distributed like the first and the second lands of the first package 21a, but the invention is not limited in this regard. For example, the packages 21a, 21b may have respective circuit substrates 22 with differing numbers of lands and/or differing land distributions. Additionally, the circuit substrate 22 of the second package 21b may include a second wire pad (not shown) to provide a site where the other end of the bonding wire 25may be connected. That is, each bonding wire 25 may electrically interconnect a first wire pad (and thus the IC chip 23) to a second wire pad (and thus the substrate 22).

The IC chip 23 of the second package 21b may be attached to the circuit substrate 22 using a conventional adhesive (not shown), for example. Here, the active surface of the IC chip 23 may face away from the circuit substrate 22 so that the back surface of the IC chip 23 may be attached to the circuit substrate 22. The adhesive may be of an aqueous type having a specified viscosity or of a film type. Numerous alternative adhesives may be suitably implemented as is well known in this art, and therefore a detailed discussion of the same is omitted.

In this example embodiment, bonding wires 25 may provide the electrical connections between the IC chip 23 and the circuit substrate 22. The bonding wires 25 may be bonded using ball bonding and/or wedge bonding techniques, for example. Further, the invention is not limited to a bonding wire 25 having a round shape. For example, the bonding wire may be a ribbon wire. Further, a TAB bonding technique may be used instead of wire bonding techniques. Numerous wire bonding, ribbon bonding and TAB bonding techniques are well known in this art, and therefore a detailed discussion of the same is omitted.

Figure 2C:
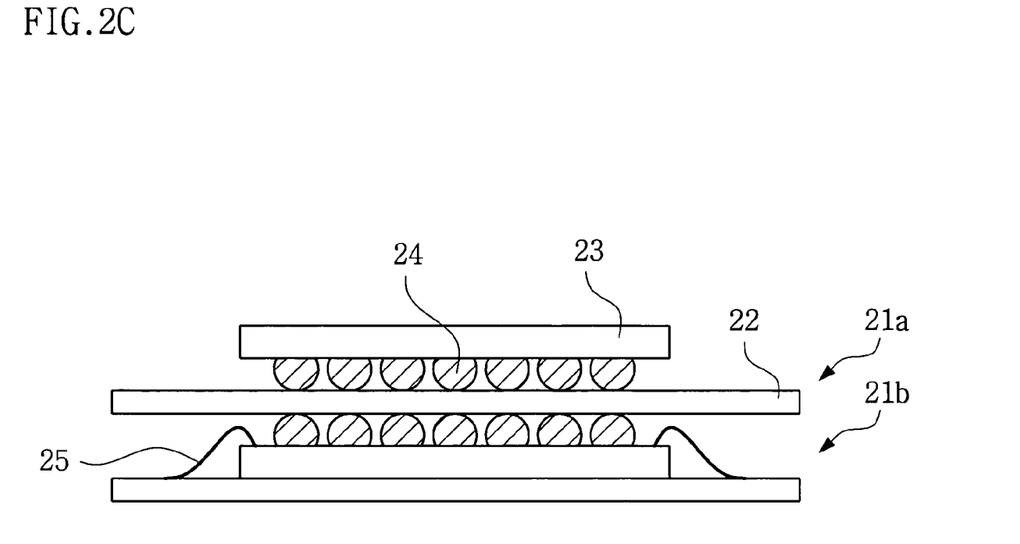

The first package 21a and the second package 21b may be stacked together as shown in FIG. 2C for example.

As shown in FIG. 2C, the first package 21a may be located on the second package 21b. The individual packages 21a and 21b may be interconnected electrically by connecting the chip bumps 24 of the second package 21b to the second lands formed on the circuit substrate 22 of the first package 21a. As shown, the active surfaces of the IC chips 23 may face in opposite directions and toward the circuit substrate 22 of the first package 21a.

Figure 2D:
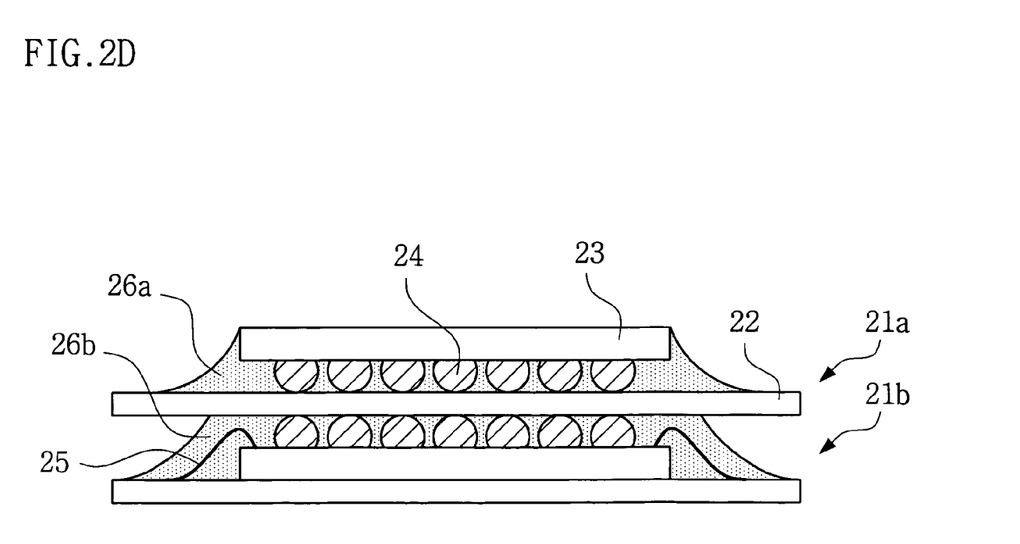

An underfill process may be performed so that encapsulating resins 26a and 26b may be formed as shown in FIG. 2D. The encapsulating resins 26a and 26b may be applied onto the surface of the circuit substrate 22 facing the IC chip 23 of the first package 21a, and between the circuit substrates 22 of the individual packages 21a and 21b. The encapsulating resin 26a may fix and protect the chip bump 24 of the first package 21a, and the encapsulating resin 26b may fix and protect the bonding wires 25 and the chip bumps 24 of the second package 21b. It will be appreciated that the encapsulating resin 26a of the first package 21a may be formed during manufacture of the first package 21a, and before the first and the second packages are stacked together.

Figure 2E:
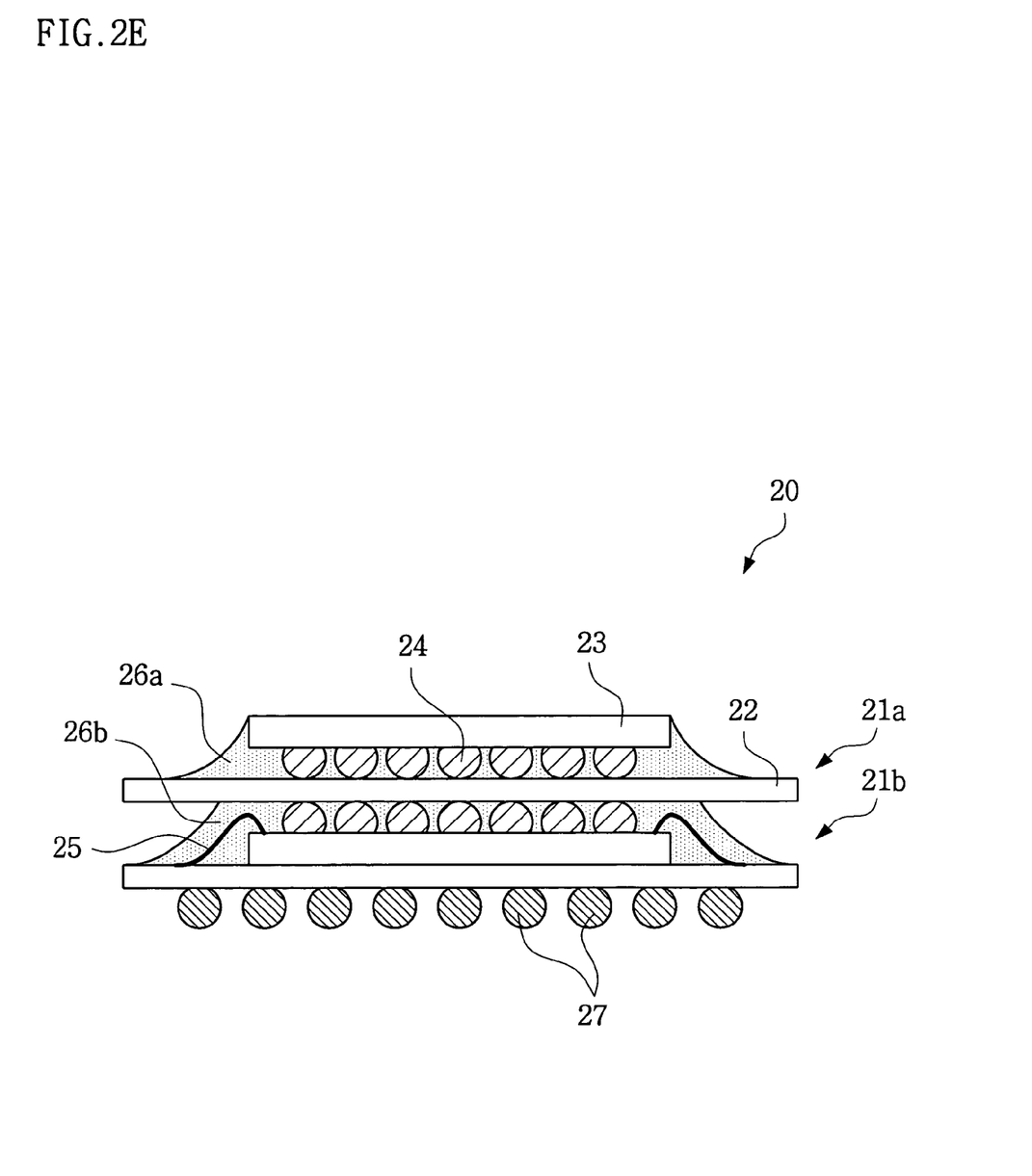

Subsequently, solder bumps 27, which may serve as external terminals of the package stack 20, may be formed as shown in FIG. 2E. The solder bumps 27 may be provided on the outward facing major surface of the circuit substrate 22 located at an end position in the package stack 20.

In this example embodiment, the stacked package 20 may have two packages inclusive of the first package 21a and the second package 21b. It will be appreciated, however, that the invention is not limited in this regard as more than two packages may be stacked together. For example, a multi-layer package stack may include a plural number of packages having a similar structure to that of the second package 21b. Additionally, in this example embodiment, the package stack 20 may use the encapsulating resins 26a and 26b, but the invention is not limited in this regard. For example, a molding resin may be used instead of the encapsulating resin to provide the package stack.

Figure 3:
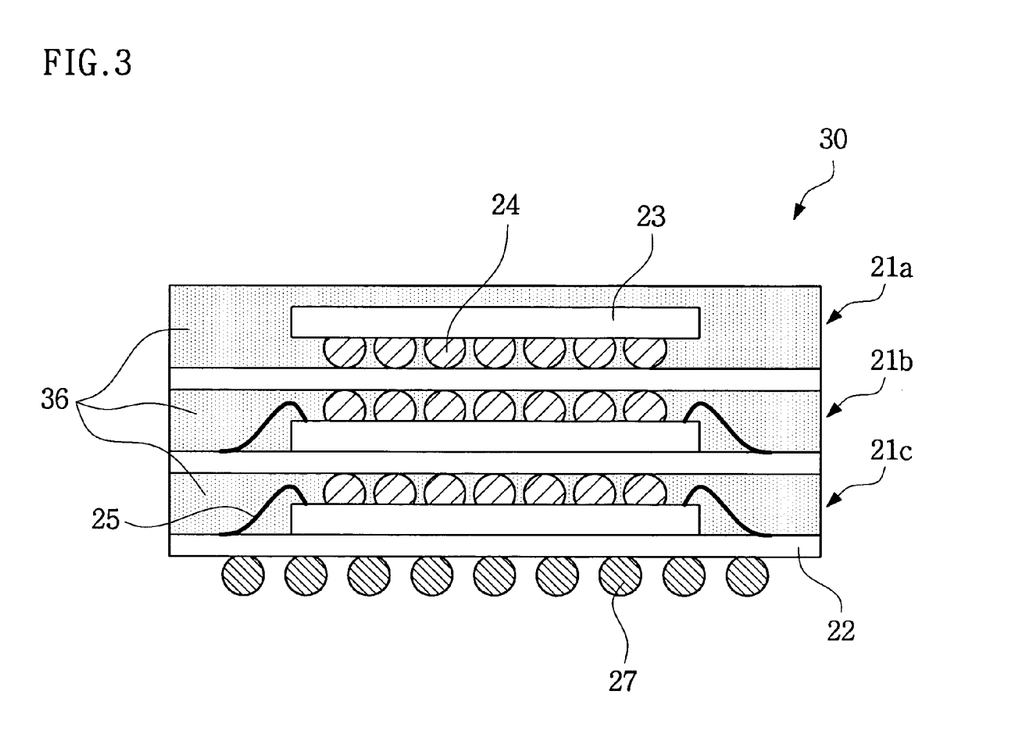
FIG. 3 is a cross-sectional view of a package stack according to another example embodiment of the present invention.

FIG. 3 is a cross-sectional view of a package stack 30 in accordance with another example, non-limiting embodiment of the present invention. Here, molding resin 36 may be used instead of encapsulating resin.

Referring to FIG. 3, the package stack 30 includes three individual packages 21a, 21b and 21c. The first package 21a may be fabricated using the techniques described above with respect to FIG. 2A, while the second package 21b and the third package 21c may be fabricated using the techniques described above with respect to FIG. 2B. The first, the second, and the third packages may be stacked using the techniques described above with respect to FIG. 2C. That is, the chip bumps 24 of the second package 21b may be electrically connected to the second lands formed on the circuit substrate 22 of the first package 21a, and the chip bumps 24 of the third package 21c may be connected to the second lands formed on the circuit substrate 22 of the second package 21b. Molding resin 36 may be applied by a molding process. Molding processes and molding resin materials are well known in this art, and therefore a detailed description of the same is omitted. Subsequently, solder bumps 27, as external terminals of the package stack 30, may be formed on the circuit substrate 22 of the third package 21c.

Figure 4:
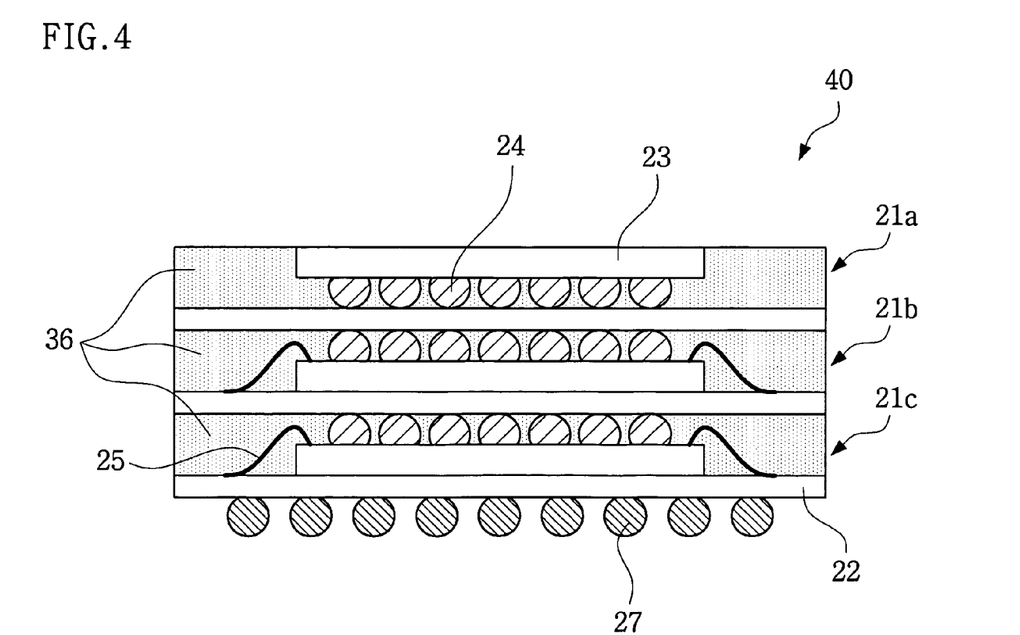
FIG. 4 is a cross-sectional view of a package stack according to anther example embodiment of the present invention.

The IC chip 23 of the first package 21a may be exposed to the outside of the molding resin 36 to improve heat dissipation characteristics in the package stack using molding resin 36 as described above. FIG. 4 is a cross-sectional view of a package stack 40 in accordance with another example, non-limiting embodiment of the present invention, wherein the IC chip 23 of the first package 21a may be exposed to the outside of the molding resin 36.

Figure 5:
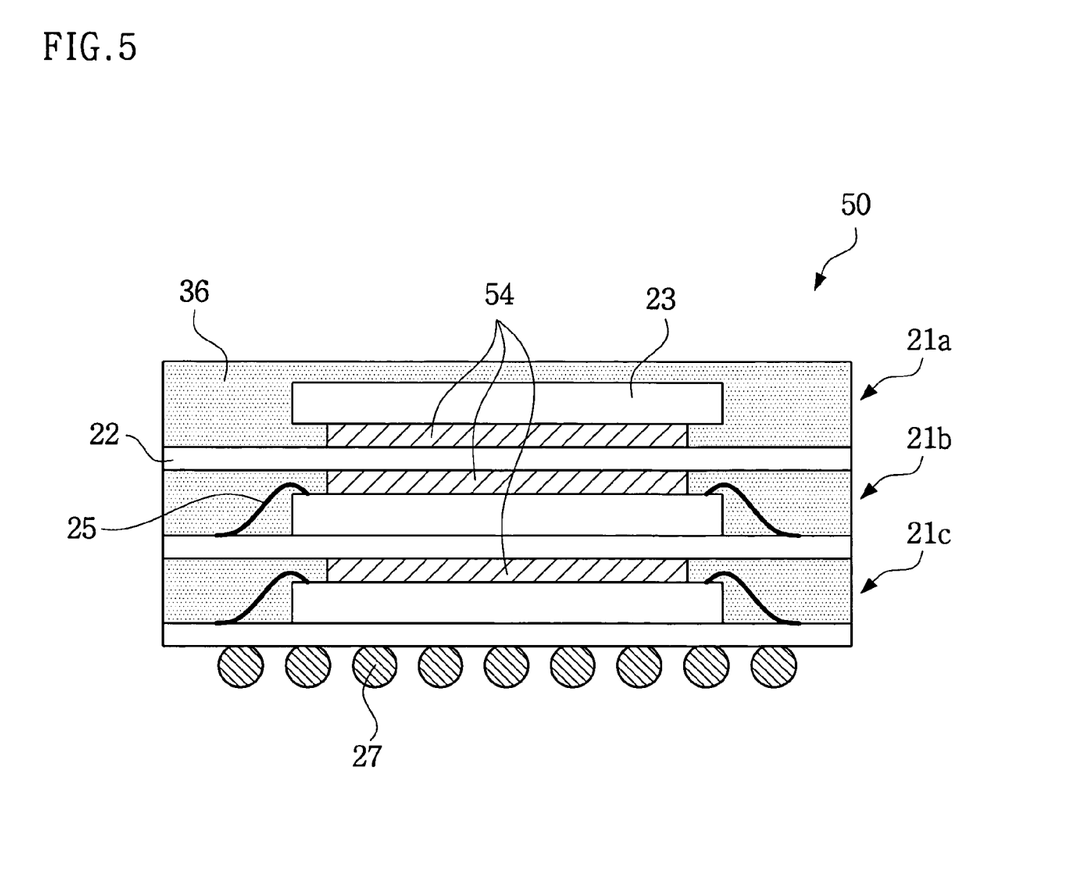
FIG. 5 is a cross-sectional view of a package stack according to another example embodiment of the present invention.

In the previous example embodiments, the chip bump 24 on the active surface of the IC chip 23 may electrically connect the IC chip 23 of one individual package to the circuit substrate 22 of another individual package. It will be appreciated, however, that the invention is not limited in this regard since other structures may be suitably implemented to provide the desired electrical connections. FIG. 5 is such an example and shows a package stack 50 in accordance with another example, non-limiting embodiment of the present invention.

Referring to FIG. 5, an anisotropic tape 54, instead of the chip bumps, may be implemented to provide the electrical connections between the IC chip 23 and the circuit substrate 22 in the first package 21a, between the first package 21a and the second package 21b, and between the second package 21b and the third package 21c. The anisotropic tape 54 may be a non-conductive tape containing conductive particles. As is well known in this art, the conductive particles in the anisotropic tape may be aligned to allow electrical conduction through the thickness of the tape, but not in the plane of the tape. The anisotropic tape 54, which may be inserted between the active surface of the IC chip 23 and the circuit substrate 22, may provide unidirectional electrical paths.

While example, non-limiting embodiments of the present invention have been shown and described in this specification, it will be understood by those skilled in the art that various changes or modifications of the embodiments are possible without departing from the spirit of the invention, as defined by the appended claims. For example, those skilled in the art will readily appreciate that the chimp bumps and the anisotropic tape may be implemented together in a single embodiment.

What is claimed is:

1. A package stack comprising:
    a first package including a first IC chip having an active surface and a back surface, and a first circuit substrate having a first major surface and a second major surface, wherein the active surface of the first IC chip faces and is electrically connected to the first major surface of the first circuit substrate; and
    a second package including a second IC chip having an active surface and a back surface, a second circuit substrate having a first major surface and a second major surface, and a first and second electrical connection means directly formed on the active surface of the second IC chip, wherein the back surface of the second IC chip faces and is disposed on the first major surface of the second circuit substrate and the active surface of the second IC chip is electrically connected to the first major surface of the second circuit substrate by the first electrical connection means;
    wherein the first package is stacked on the second package and the active surface of the second IC chip faces and is electrically connected to the second major surface of the first circuit substrate by the second electrical connection means.

2. The package stack of claim 1, wherein the first package includes a chip bump provided on the active surface of the first IC chip, and the active surface of the first IC chip is electrically connected to the first major surface of the first circuit substrate by the chip bump.

3. The package stack of claim 1, wherein the first package includes an anisotropic tape inserted between the active surface of the first IC chip and the first major surface of the first circuit substrate, and the active surface of the first IC chip is electrically connected to the first major surface of the first circuit substrate by the anisotropic tape.

4. The package stack of claim 1, wherein the second electrical connection means is a chip bump.

5. The package stack of claim 1, wherein the second electrical connection means is an anisotropic tape inserted between the active surface of the second IC chip and the second surface of the first circuit substrate.

6. The package stack of claim 1, further comprising one of an encapsulating resin and a molding resin provided on the first major surface of the first circuit substrate and between the first circuit substrate and the second circuit substrate.

7. The package stack of claim 1, further comprising a third package including a third IC chip having an active surface and a back surface, and a third circuit substrate having a first major surface and a second major surface, wherein the back surface of the third IC chip faces the first major surface of the third circuit substrate, and the active surface of the third IC chip is electrically connected to the first major surface of the third circuit substrate, wherein the second package is stacked on the third package, and the active surface of the third IC chip is electrically connected to the second major surface of the second circuit substrate.

8. The package stack of claim 1, wherein the active surface of the second IC chip is electrically connected to the first major surface of the second circuit substrate by a bonding wire.

9. The package stack of claim 1, wherein second electrical connection means is a bonding wire.

10. A method comprising:
providing a first package having a first IC chip with an active surface and a back surface, wherein the active surface faces and is electrically connected to a first major surface of a first circuit substrate;
providing a second package having a second IC chip with an active surface and a back surface, and a first and second electrical connection means directly formed on the active surface of the second IC chip, wherein the back surface faces and is disposed on a first major surface of a second circuit substrate, and wherein the active surface is electrically connected to the first major surface of the second circuit substrate by the first electrical connection means; and stacking the first and the second packages so that the active surface of the second IC chip faces and is electrically connected to a second major surface of the first circuit substrate by the second electrical connection means.

11. The method of claim 10, further comprising providing a chip bump on the active surface of the first IC chip to electrically connect the first IC chip to the first circuit substrate.

12. The method of claim 10, further comprising providing an anisotropic tape between the active surface of the first IC chip and the first major surface of the first circuit substrate to electrically connect the first IC chip to the first circuit substrate.

13. The method of claim 10, wherein the second electrical connection means is a chip bump.

14. The method of claim 10, wherein the second electrical connection means is an anisotropic tape.

15. The method of claim 10, further comprising providing one of an encapsulating resin and a molding resin on the first major surface of the first circuit substrate and between the first circuit substrate and the second circuit substrate.

16. The method of claim 10, further comprising:
providing a third package with a third IC chip having an active surface and a back surface, wherein the back surface faces a first major surface of a third circuit substrate, and wherein the active surface is electrically connected to the first major surface of the third circuit substrate; and
stacking the second package and the third package so that the active surface of the third IC chip faces and is electrically connected to a second major surface of the second circuit substrate.

17. The method of claim 10, wherein the first electrical connection means is a bonding wire.

18. A package stack manufactured in accordance with the method of claim 10.

* * * * *